United States Patent [19]

Behun et al.

[11] Patent Number: 5,060,844
[45] Date of Patent: Oct. 29, 1991

[54] INTERCONNECTION STRUCTURE AND TEST METHOD

[75] Inventors: John R. Behun; Anson J. Call, both of Poughkeepsie; Francis F. Cappo; Marie S. Cole, both of Wappingers Falls, all of N.Y.; Karl G. Hoebener, Georgetown, Tex.; Bruno T. Klingel, Hopewell Junction; John C. Milliken, Patterson, both of N.Y.

[73] Assignee: International Business Machines Corporation, Armonk, N.Y.

[21] Appl. No.: 555,120

[22] Filed: Jul. 18, 1990

[51] Int. Cl.$^5$ .................. B23K 1/00; B23K 101/40
[52] U.S. Cl. ................... 228/180.2; 228/203; 228/215; 228/246
[58] Field of Search .............. 228/180.2, 203, 214, 228/215, 245, 246, 248, 254, 56.3; 29/840, 876, 883

[56] References Cited

U.S. PATENT DOCUMENTS

| | | | |
|---|---|---|---|
| 3,835,531 | 9/1974 | Luttmer | 228/180.2 |
| 4,012,832 | 3/1977 | Crane | 29/575 |
| 4,237,607 | 12/1980 | Ohno | 29/840 |
| 4,376,505 | 3/1983 | Wojcik | 228/180.2 |
| 4,545,610 | 10/1985 | Lakritz et al. | 29/589 |
| 4,585,157 | 4/1986 | Belcher | 228/180.2 |
| 4,604,644 | 8/1986 | Beckham et al. | 228/180.2 |
| 4,661,192 | 4/1987 | McShane | 156/292 |
| 4,673,772 | 6/1987 | Satoh et al. | 174/52 |
| 4,701,482 | 10/1987 | Itoh et al. | 523/435 |
| 4,749,120 | 6/1988 | Hatada | 228/180.2 |
| 4,830,264 | 5/1989 | Bitaillou et al. | 228/245 |

FOREIGN PATENT DOCUMENTS 76663  4/1985  Japan .................................. 228/246

Primary Examiner—Samuel M. Heinrich
Attorney, Agent, or Firm—Ira David Blecker

[57] ABSTRACT

Disclosed is a connector structure on a substrate which includes at least one first solder portion on the surface of the substrate; at least one second solder portion connected to each of the at least one first solder portions; and an epoxy layer disposed about the at least one first and second solder portions in such a manner as to cover the first solder portion and contact, but not cover, the second solder portion.

Also disclosed is a connector structure on a substrate which includes at least one first solder portion on the surface of said substrate; at least one second solder ball portion connected to the at least one first solder portions; wherein the melting point of the second solder ball portion is relatively higher than that of the first solder portion.

Finally, disclosed is a method of testing the solderability of the above structures.

15 Claims, 2 Drawing Sheets

INTERCONNECTION STRUCTURE AND TEST METHOD

BACKGROUND OF THE INVENTION

The invention relates to a new pinless connector structure. More particularly, it provides a solder ball configuration of high melting point solder balls connected to the substrate by lower melting point solder and, preferably, surrounded by an epoxy coating. The high melting point balls are readily joined by additional low melting point solder connectors to another substrate. The invention further provides a method for readily testing the wettability of the low/high solder connections.

DESCRIPTION OF THE PRIOR ART

The industry has moved away from the use of pins as connectors for electronic packaging due to the high cost of fabrication, the unacceptable percentage of failed connections which require rework, the limitations on I/O density and the electrical limitations of the relatively high resistance connectors. Solder balls are superior to pins in all of the above features as well as being surface mountable, which has obvious implications given the increasingly small dimensions in the forefront technologies today.

Solder mounting is hardly a new technology, itself. But, the need remains to improve the solder systems and configurations in electronic structures. The use of solder ball connectors has been applied to the mounting of integrated circuit chips using the so-called C-4 (controlled collapse chip connection) technology since the method and structure were first described and patented in U.S. Pat. Nos. 3,401,126 and 3,429,040 of Miller, which are assigned to the present assignee. A myriad of solder structures have since been proposed for the mounting of IC chips, as well as for interconnection of other levels of circuitry and associated electronic packaging.

The basic structure is that of a minute solder portion, generally a ball, connected to a bonding site on one of the parts to be electrically joined. The assembly of part, bonding pad and solder is then brought into contact with a solderable pad on a second part and the solder is reflowed to achieve the connection. The "second" part will hereinafter be referred to as a board, although it is evident and fully intended from the context of the subject invention that the second part can be a substrate, a card, a board, a chip or any other electronic part to which electrical connection is desired. One of the major drawbacks to this configuration is that the solder balls do not always remain in place prior to connection, or during processing, or during rework. During rework, not only the solderable pad but also the solder, itself, becomes molten. There is no guarantee, therefore, that the solder will remain associated with the first part. A partial solution to this latter concern is to use a sandwich structure such as is illustrated in U.S. Pat. No. 4,673,772 of Satoh, et al wherein a high melting point (hereinafter HMP) solder column is connected to the part with a lower melting point solder. The part, low melting point (hereinafter LMP) solder and HMP solder are then placed into contact with a LMP solder portion of a second part, or hereinafter board, to which it is desired to electrically connect said first part. The assembly is then heated to a temperature sufficient to melt the LMP solder and achieve the connection. The Satoh structure requires that the HMP solder be "wrought" solder, i.e. solder which has been worked and heat-treated to achieve particular mechanical properties. Although a solution to the rework concern in part, the Satoh structure does not provide a completely workable structure. For example, it is also necessary to test at least a few sample structures for wettability of the HMP solder before committing thousands of parts to assembly. Wettability testing entails coupling a test part with its HMP solder to a LMP solder portion as found on a board to test whether the solderable pad on the test board will wet to the first structure, specifically to the HMP solder. Success of the testing also requires successful subsequent removal of the part from the test board without losing the HMP solder to the board. The complete test, as such, also tests the reworkability of the structure. Since the bonding pad of the first part and the solderable portion of the board both have low melting points, there is still a likelihood of the HMP solder detaching from the part when each LMP connection becomes molten.

A final concern with the earlier structures, including Satoh, is that, during heating for attachment, a volume of the LMP solder from the board will wet not only to the associated surface of the HMP solder, but also neck up the sides of the HMP solder and wet to the LMP solder bonding pad located on the first part. When this happens, the LMP solder flows out from the bonding pad on the part and "bridging", i.e. shorting between pads, occurs.

What is needed, therefore, is a testable, connector structure which avoids the problems cited above.

It is therefore an objective of the present invention to provide a solder connector structure which is reworkable.

It is another objective of the present invention to provide a testing structure for use with solder ball connector structures.

It is yet another objective of the present invention to provide a solder connector structure which can be readily and repeatedly tested.

It is a final objective of the present invention to provide a means for physically maintaining the integrity of the connections in a solder ball configuration.

BRIEF DESCRIPTION OF THE INVENTION

These and other objectives are realized by the subject invention wherein at least one high melting point solder ball is connected to a part by associated low melting point solder. According to one aspect of the invention, the surface of the part, to which the low and high melting point solders are attached, is then coated with a liquid epoxy, which is subsequently cured. The epoxy serves to hold the HMP solder ball in place prior to processing, during processing and during rework. The epoxy layer additionally serves to prevent the shorting or bridging of pads which can otherwise occur during the attachment of the low/high assembly to the next level of packaging. The low/high assembly of the part is then interconnected to a board or other level of packaging by means of an additional low melting point solder portion, which can be associated with the high melting point solder ball or a bonding surface on the board or other package. This improved assembly not only provides a superior package for connection purposes, but also is more readily testable. According to a second aspect of the invention, the epoxy coating is not utilized.

The invention addresses the testing of the novel part as a function of the structure itself; and additionally provides an improved testing method. The improved testing method comprises a testing structure which has LMP solder disposed in a board in a pattern which mirrors the footprint of the part's solder connectors which are to be tested for wettability. The board is placed in contact with the part to be tested and the LMP solder reflowed. The wettability of the part is thereby ascertained as is its likelihood for bridging. In addition, the part can be readily removed after testing without the danger of losing some of the tested connections.

The invention will be described in greater detail hereinafter and in reference to the accompanying figures wherein.

DETAILED DESCRIPTION OF THE INVENTION

As noted above, the subject invention can be applied for use in connecting any parts which require electrical connection. In the electronics arena, there are a myriad of structures which require connection to other similar structures or to other levels of packaging. Examples include mounting an integrated circuit chip to a metallized substrate; mounting a card on which several chips have been mounted to a board which provides interconnection circuitry; etc. For the sake of clarity and consistency in describing the present invention, two specific structures will be referred to throughout the specification. A first part to which interconnection is desired and a second part to be connected to the first part; hereinafter, the "part" and the "board", respectively. Essentially, the part is an electronic structure having dielectric and metallic sections. The metallized sections terminate at the surface of the part. Generally, there are metallized bonding pads which connect to the internal metallurgy and which are provided at the surface of the part for interconnection purposes. It will be assumed that the board, too, is a dielectric material which has metallized areas which also terminate at metal bonding pads. Interconnection of the associated metallurgy is desired, as well as testability of the connector structures.

Figure 1A:
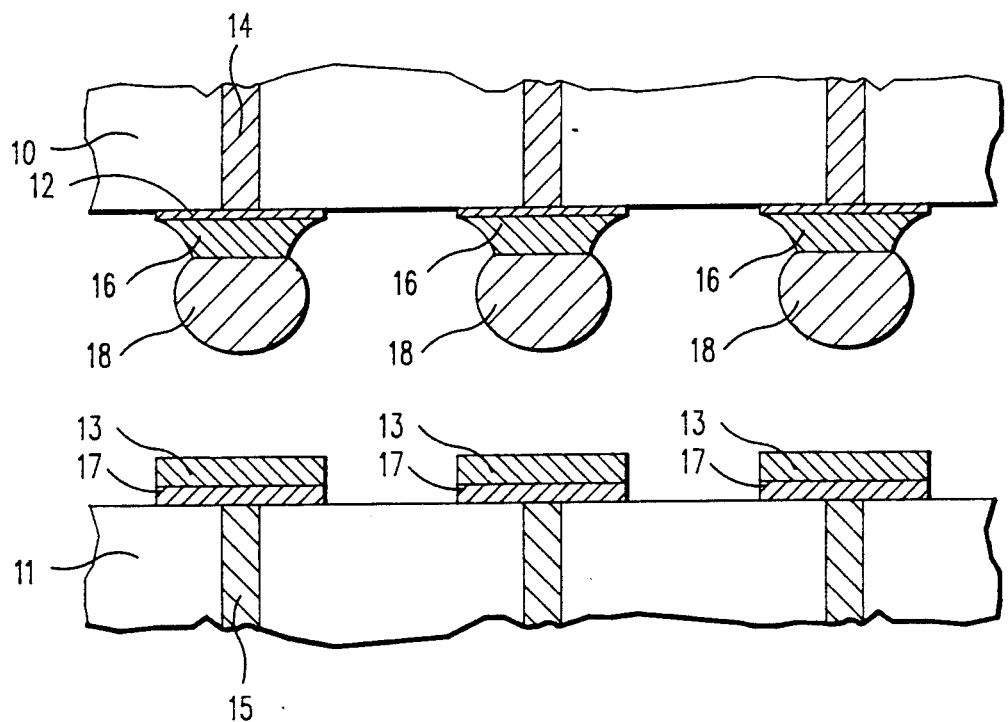
FIG. 1A illustrates a structure having combined low and high melting point solder connections.

In FIG. 1A, a part 10 is to be joined to a board 11. Part 10 has internal metallurgy 14 which terminates at the surface at bonding pads 12. A low melting point (LMP) solder 16 is applied to bonding pad 12. A high melting point (HMP) solder ball 18 is placed in contact with LMP solder 16, and the assembly is heated to reflow the LMP solder, which then wets to the non-molten HMP solder ball.

The terms low melting point, LMP, and high melting point, HMP, are not terms having specific temperatures associated with them. The requirement for the subject invention is that the solder which is applied to the bonding pad on the part have a lower melting point than that of the HMP solder ball. Examples of materials which are suitable include a eutectic solder of 37/63 weight percent Pb/Sn for the LMP material and a non-eutectic solder composition of 90/10 weight percent Pb/Sn for the HMP material. There are a wide range of materials which would be suitable for the subject invention, many of which are recited throughout the art with reference to solder connections.

It is possible to apply (screen) the LMP solder paste to the HMP ball and then bring the bonding surface (pad) into contact with the LMP solder, thereby causing the LMP solder paste and HMP ball to become attached to the bonding pad. An alternative method is to screen the LMP solder in the form of paste onto the bonding pad and then bring the HMP ball and LMP solder into contact. The order of application steps is not critical to the invention.

Once the assembly of part 10 with bonding pad 12, LMP solder 16 and HMP ball 18 has been fabricated, it is ready to be joined to the next level of packaging, hereinafter the "board" 11. Board 11 is also illustrated with internal metallurgy 15, terminating on the surface at a bonding pad 17. In both the instance of the part and of the board, if the bonding pad is fabricated of a LMP solder pad, it alone may serve as both the bonding pad and the LMP solder. For purposes of illustration, the two functions will be separated and assigned to separate parts, pad and solder.

In accordance with the subject invention, the assembled part 10 with pad 12, LMP solder 16 and HMP ball 18 is brought into contact with part 11 having pad 17 and LMP solder 13, and the two are heated to a temperature sufficient to reflow the LMP solder but not sufficient to melt the HMP solder ball. The LMP solder 13 which is attached to the bonding pad 17, on board 11, will wet the HMP ball and connection will be achieved.

It should be noted, and evident to those having skill in the art, that the low melting point solder which is associated with the board may be applied directly to a bonding pad such as 17 in FIG. 1A, or may be applied to the HMP ball 18, at the outer connection surface, prior to joining the part/ball assembly to the board. The LMP solder can be applied to the HMP ball as an additional portion of the part assembly, which would then consist of the part, LMP solder, HMP solder ball and LMP solder. If the latter method is chosen, the assembled part may then be brought into contact with the board, having only a wettable bonding pad at its surface; and the part and board heated, as above, to a temperature sufficient to reflow the LMP solder which is located on the part and is in contact with the bonding pad on the board. The LMP solder 13 used at the ball-to-board interface can be a third solder composition or the same LMP solder 16 used at the part-to-ball interface.

Figure 1B:
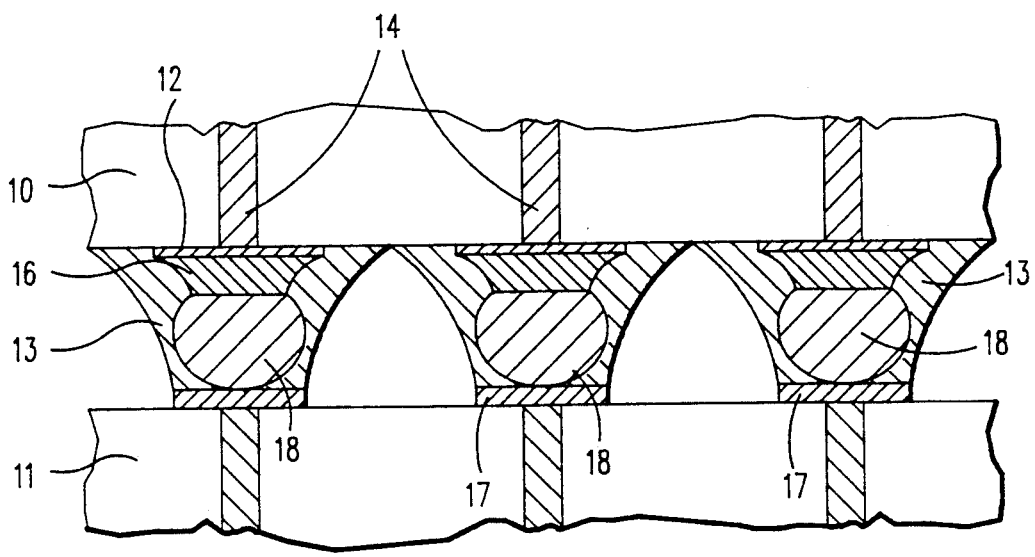
FIG. 1B illustrates the problem of bridging between LMP solder portions in a connector assembly.

FIG. 1B illustrates the problem of bridging which may occur when using the above method. The LMP solder 13, associated with board 11 may, when heated, neck up the sides of the HMP ball 18, and wet the LMP solder 16, associated with the bonding pad 12, on the part. The result is shorting between adjacent bonding sites, as defined by bonding pad and LMP solder 13 and 16. The ultimate result is, of course, an unusable part.

Figure 2:
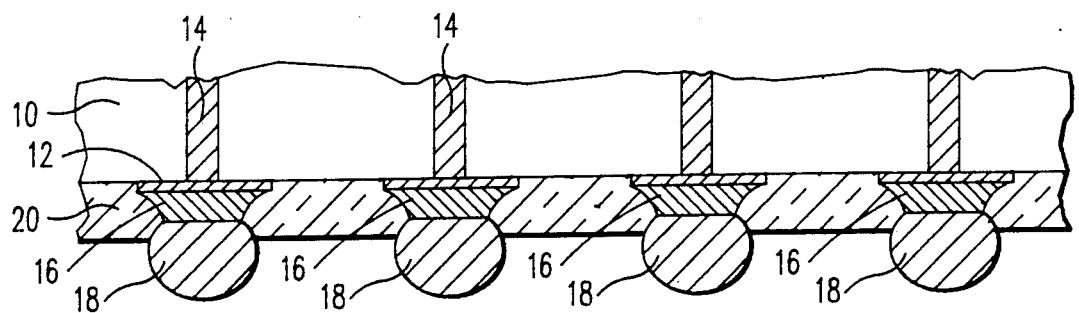
FIG. 2 illustrates connection of the high melting point solder ball to the part by means of a LMP solder portion.
Figure 3:
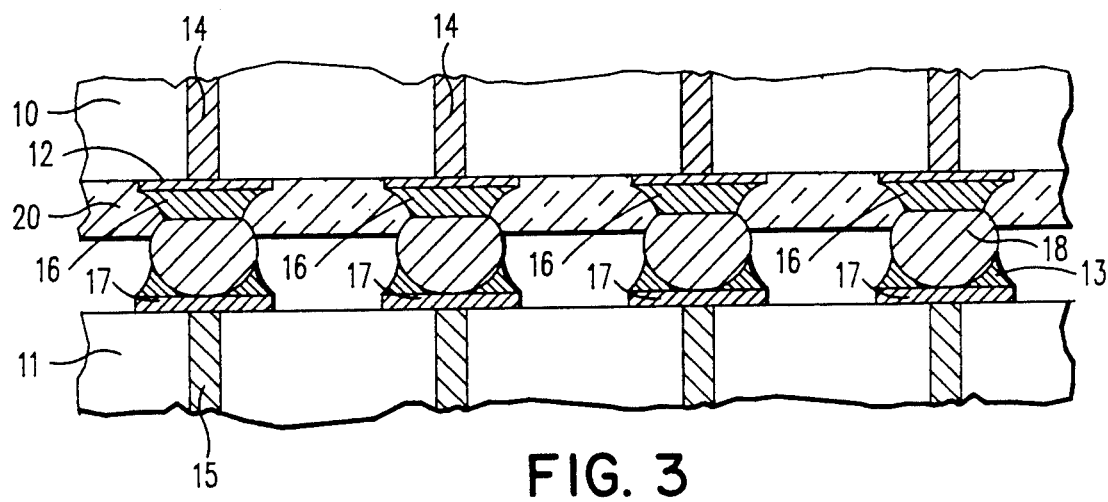
FIG. 3 illustrates the connection of the FIG. 2 part to a board. The part/LMP solder/HMP ball structure is connected by low melting point solder to the board.

A preferred embodiment of the invention, as illustrated in FIGS. 2 and 3, solves this bridging problem. The structure and its method of fabrication are consistent with that illustrated above up to and including the application of the HMP solder balls to the part. It is at this stage of fabrication that layer 20 of FIG. 2 is applied. Layer 20 is an epoxy layer which is applied to the surface of the part in a thickness sufficient to cover the LMP solder 16, and contact, but not cover, the HMP solder ball 18. The layer is applied as a liquid which is subsequently solidified by heat treatment or by cooling, depending upon the epoxy chosen.

The epoxy is chosen to be one of the type developed for use with electronic components such as is taught in U.S. Pat. No. 4,701,482 of Itoh, et al., the disclosure of which is incorporated by reference herein. The Itoh patent recites the qualities which are desirable in an epoxy which is developed for electronic applications, at Col. 1, lines 36-45. Those qualities are desirable for the subject invention, along with the requirement that the epoxy have superior flowability; i.e. that it will readily flow to cover the surface of the part evenly. Other epoxies suitable for use in the present invention are those disclosed in Christie, et al., U.S. patent application Ser. No. 493,126, filed Mar. 14, 1990, the disclosure of which is incorporated by reference herein.

The preferred method for applying the epoxy for the present invention is by introducing the liquid epoxy to the surface with a dispensing needle. In the instances of large part surfaces, it may be desirable to inject the liquid at several locations on the surface at the same time to insure coverage.

The geometry of the solder structure assists in the even distribution of liquid since the liquid will not readily climb the sidewalls of the solder balls 18.

It is envisioned that the epoxy retaining layer can be utilized with other solder systems as well as with the preferred LMP/HMP ball structure herein.

As illustrated in FIG. 2, the epoxy layer should cover the LMP solder 16 but, preferably, not entirely cover the HMP solder balls. It would be preferred to have the epoxy layer contact between about 20-80% of the "height" of the HMP solder ball. The preferred amount of epoxy will, of course, depend on manufacturing and use conditions. It should be understood, however, that it is preferred that the epoxy not fully encapsulate the HMP solder ball and the joint. The reasons for this are at least twofold. The first is that reworkability of the arrangement is destroyed. Secondly, heat may be trapped in the fully encapsulated joint such that warping of the board may occur. It is possible, however, although not preferred, for the epoxy to fully encapsulate the joint should reworkability not be necessary or heat buildup not be a problem. In FIG. 3, the part 10 with LMP solder 16, HMP solder ball 18, and epoxy layer 20 is joined to the board 11. As noted above, the LMP solder which is associated with the bonding surface on the board may be applied directly to the bonding pads 17 on board 11; or, may first be applied to the exposed surface of HMP solder ball 18 prior to bringing the part and board into contact with each other. In either instance, the LMP solder 13 is available at the interface when the part and the board are brought together. The part and board are placed in contact with each other and the assembly heated to reflow the LMP solder 13. Upon cooling, the part and board are joined.

A further aspect of the subject invention is the testability of the assembly. It is advantageous to test the part 10 with its associated pad 12, LMP solder 16 and HMP ball 18 prior to attempting to join the part to a board. The test which is conducted at this point is a wettability test, as described above. The disadvantages of testing in the past have included the possibility of "losing" the HMP ball during testing. The current structure eliminates this problem by means of the epoxy layer. The epoxy literally holds the HMP ball in place during testing and during any rework. The current invention additionally provides a testing structure which can be even utilized prior to the application of the epoxy layer and which will eliminate the concern of inadvertently removing the HMP balls.

Figure 4A:
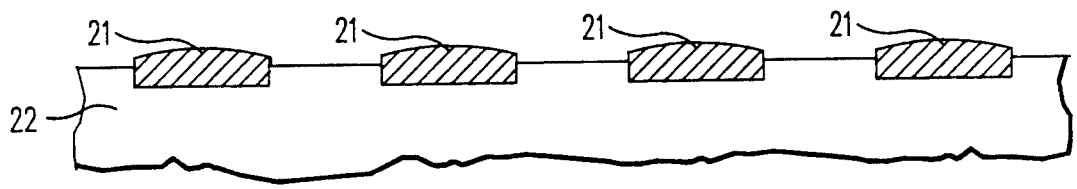
FIGS. 4A and 4B illustrate alternative embodiments of testing plates having LMP solder disposed therein in an array which mirrors the footprint of the part/LMP/HMP ball structure.
Figure 4B:
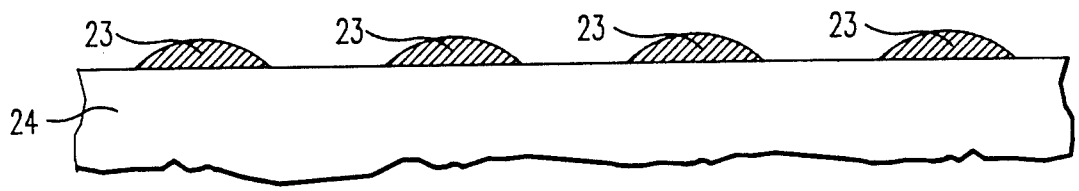

The test structure is illustrated in FIGS. 4A and 4B as alternative embodiments shown in partial cross section. The wettability test requires that LMP solder be reflowed onto the HMP balls to determine the wettability of the balls. The inventive structure and test provide an interposer 22 or 24 onto which are disposed LMP solder balls in the exact footprint correlating to the connections on the part to be tested. LMP solder 21 in FIG. 4A or 23 in FIG. 4B are brought into contact with the HMP balls to be tested. Note that interposer 22 has recesses which partially contain the solder 21. The configuration is heated to reflow the LMP solder—again at a temperature which is not sufficient to melt the HMP balls—to see if it will wet to the HMP balls. Once the wettability has been determined, the assembly is again heated to remove the interposer/test piece. The fact that the LMP solder pieces are disposed in the interposer as shown in FIG. 4A assures that the solder will disengage from the HMP balls and that the HMP balls will not shift position. It is not significant to the testing that some LMP solder remain on the HMP balls. The balls will not shift during heating, during which the LMP solder by which the balls are attached to the part, may well melt. The presence of the rigid interposer will prevent shifting of the HMP balls.

The interposer should be fabricated of material which will not be affected by the heating procedure. Glass or ceramic are the preferred materials onto which the LMP solder should be deposited.

The LMP solder may also be deposited on the surface of the interposer as shown in FIG. 4B in a pattern, but in that instance the LMP solder itself will not be physically restrained during the testing and may contribute to shifting of the balls if the test piece is not held stationary laterally. In addition, if the test LMP solder is disposed on the glass or ceramic, it will be more prone to remain on the HMP solder balls after separation of the part from the interposer.

The process flow associated with the inventive test structure and method is as follows:
assemble part with solder balls of HMP solder and epoxy;
apply LMP solder to a glass plate;
press the part and solder balls into the paste; and reflow.

It is apparent that the subject test method and structure may be utilized prior to the application of epoxy to the part.

While the invention has been described with reference to a preferred embodiment, it will be understood by those skilled in the art that the foregoing and other changes in methodology and detail may be made without departing from the spirit and scope of the invention.

What is claimed is:

1. A method for obtaining an electrical interconnection assembly on an electronic structure comprising the steps of:
   applying at least one first solder portion to the surface of said structure;
   applying at least one second solder portion to the at least one first solder portion; and
   disposing a first dielectric medium on the surface of said structure covering said at least one first solder portion and contacting, but not covering, said at least one second solder portion.

2. The method of claim 1 further comprising the step of disposing at least one third solder portion on said at least one second solder portion.

3. The method of claim 1 wherein said at least one first solder portion has a melting point which is lower than that of said at least one second solder portion.

4. The method of claim 2 wherein said at least one third solder portion has a melting point which is lower than that of said at least one second solder portion.

5. The method of claim 1 wherein said first dielectric medium is epoxy and wherein said disposing step comprises dispensing liquid epoxy on said surface; and solidifying said epoxy.

6. A method for obtaining electrical interconnection of two electronic structures comprising the steps of:
   applying at least one first solder portion to the surface of the first of said structures;
   applying at least one second solder portion to the at least one first solder portion;
   disposing a first dielectric medium on the surface of said first structure covering said at least one solder portion and contacting, but not covering, said at least one second solder portion;
   applying at least one third solder portion to the surface of the second of said structures;
   bringing the at least one second solder portion associated with said first structure into contact with the at least one third solder portion on said second structure; and
   heating the contacted portions to a temperature sufficient to melt at least one of the contacting solder portions.

7. The method of claim 6 wherein said heating comprises heating to the melting temperature of said third solder.

8. The method for obtaining electrical interconnection of two electronic structures comprising the steps of;
   applying at least one first solder portion to the surface of the first of said structures;
   applying at least one second solder portion to the at least one first solder portion;
   disposing a first dielectric medium on the surface of said first structure covering the at least one first solder portion and contacting, but not covering, said at least one second solder portion;
   applying at least one third solder portion to the exposed surface of said at least one second solder portion;
   providing at least one bonding site on the surface of said second structure;
   bringing the at least one third solder portion associated with said first structure into contact with said at least one bonding site on the second structure; and
   heating the at least one contacted portion and site to a temperature sufficient to melt the at least one third solder portion.

9. The method of claim 8 wherein said heating comprises heating to a temperature which is sufficient to melt said at least one third solder portion but not sufficient to melt said at least one second solder portion.

10. A method for obtaining an electrical interconnection structure comprising the steps of:
    applying at least one first solder portion to the surface of a substrate;
    applying at least one second solder ball portion to the at least one first solder portion;
    wherein the melting point of said second solder ball portion is relatively higher than said first solder portion.

11. The method of claim 10 further comprising the step of applying at least one third solder portion to the at least one second solder ball portion wherein said third solder portion has a melting point which is relatively lower than that of said second solder ball portion.

12. The method of claim 11 further comprising the steps of:
    providing a second substrate having at least one bonding site on the surface thereof;
    bringing the at least one third solder portion into contact with said at least one bonding site; and
    heating said structure to a temperature sufficient to melt the at least one third solder portion but not sufficient to melt said at least one second solder ball portion.

13. The method of claim 12 wherein one of said substrate and second substrate is a metallized ceramic substrate and the other of said substrates is an organic printed circuit card.

14. The method of claim 10 further comprising the steps of:
    providing a second substrate having at least one bonding site on the surface thereof;
    applying at least one third solder portion to the at least one bonding site wherein said third solder portion has a melting point which is relatively lower than that of said second solder ball portion;
    bringing the at least one third solder portion into contact with said at least one second solder ball portion;
    heating said structure to a temperature sufficient to melt the at least one third solder portion but not sufficient to melt said at least one second solder ball portion.

15. The method of claim 14 wherein one of said substrate and second substrate is a metallized ceramic substrate and the other of said substrates is an organic printed circuit card.

* * * * *